United States Patent [19]

Fujimoto

[11] Patent Number: 5,445,977
[45] Date of Patent: Aug. 29, 1995

[54] METHOD OF FABRICATING A SCHOTTKY FIELD EFFECT TRANSISTOR

[75] Inventor: Kazuhisa Fujimoto, Neyagawa, Japan

[73] Assignee: Matsushita Electric Industrial Co., Ltd., Osaka, Japan

[21] Appl. No.: 180,224

[22] Filed: Jan. 11, 1994

Related U.S. Application Data

[62] Division of Ser. No. 53,047, Apr. 23, 1993, abandoned.

[30] Foreign Application Priority Data

Apr. 24, 1992 [JP] Japan .................. 4-106330

[51] Int. Cl.6 .................. H01L 21/265
[52] U.S. Cl. .................. 437/40; 437/912; 437/177; 437/27; 437/41
[58] Field of Search .................. 437/912, 177, 27, 40, 437/41

[56] References Cited

U.S. PATENT DOCUMENTS

| | | | |
|---|---|---|---|
| 3,513,366 | 5/1970 | Clark | 437/912 |
| 4,179,533 | 12/1979 | Christou et al. | 437/177 |
| 4,213,840 | 7/1980 | Omori et al. | 437/177 |
| 4,859,618 | 8/1989 | Shikata et al. | 437/177 |
| 4,923,823 | 5/1990 | Kohno | 437/177 |
| 4,929,568 | 5/1990 | Beasom et al. | 437/40 |
| 5,187,111 | 2/1993 | Nogami et al. | 437/912 |
| 5,225,360 | 7/1993 | Shim et al. | 437/912 |
| 5,314,833 | 5/1994 | Lee et al. | 437/912 |

FOREIGN PATENT DOCUMENTS

| | | |
|---|---|---|
| 61-16577 | 1/1986 | Japan . |
| 61-135166 | 6/1986 | Japan . |
| 2-2639 | 1/1990 | Japan . |
| 0050744 | 3/1991 | Japan .................. 437/912 |

*Primary Examiner*—Brian E. Hearn
*Assistant Examiner*—Lynne A. Gurley
*Attorney, Agent, or Firm*—Ratner & Prestia

[57] ABSTRACT

A field effect transistor structure is disclosed. A SiN insulating layer is deposited on a semi-insulating GaAs substrate. A slit window is formed to determine the effective gate length formed after pattern forming a high density n-type region by ion implanting on the semi-insulating GaAs substrate. A n-type active region is formed by ion implanting a p-type impurity. An insulating layer is used as an ion implanting mask in a partial compensation of the n-type region. At the same time, a p-type region is formed under the n-type active region. A high melting point to make a Schottky gate electrode is deposited and then annealed. The high melting point metal layer is left as a gate electrode and a low specific resistance connecting metal layer is deposited on the gate electrode.

6 Claims, 3 Drawing Sheets

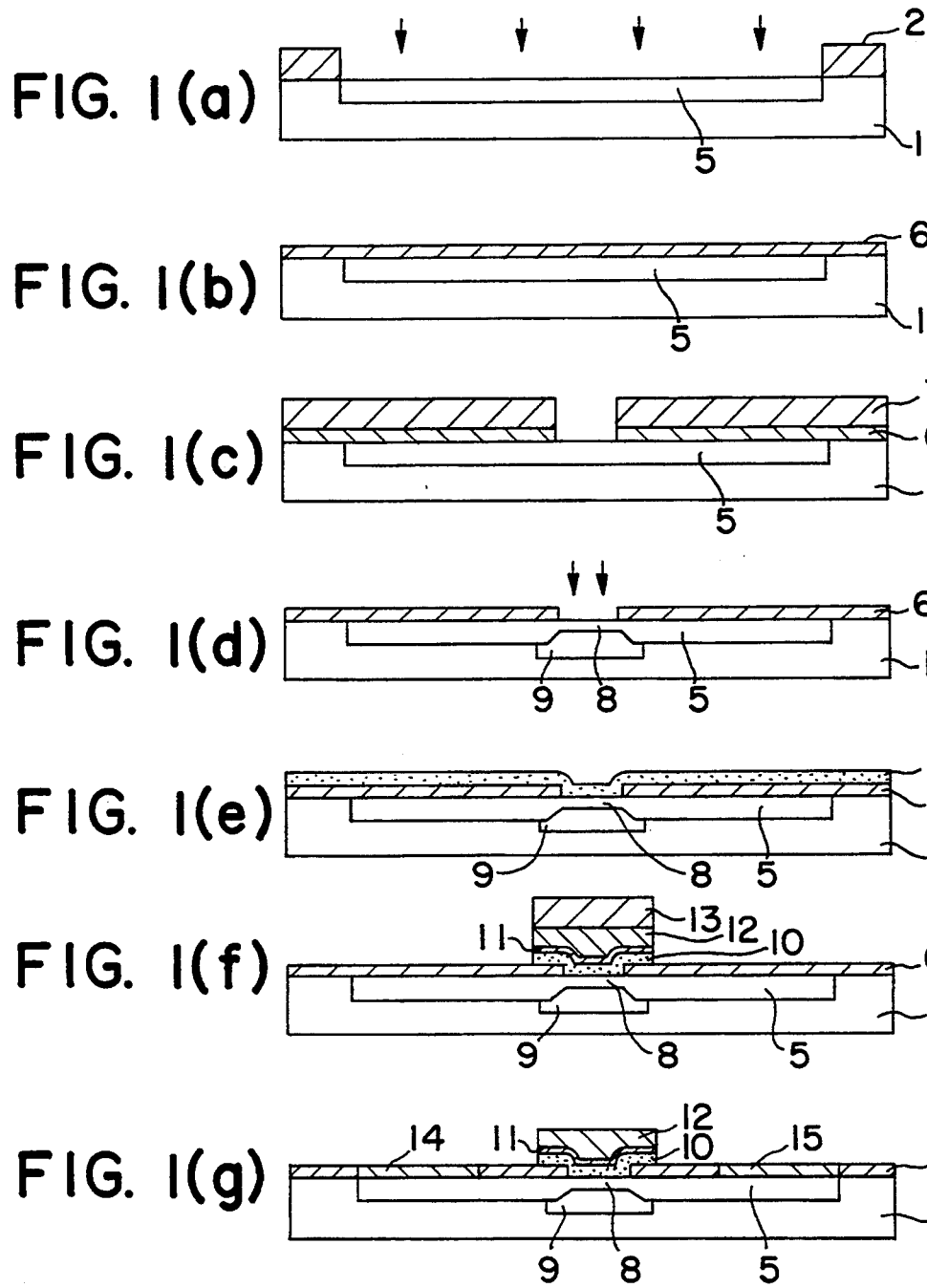

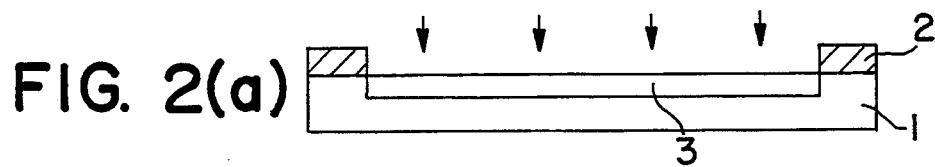
FIG. 2(a)
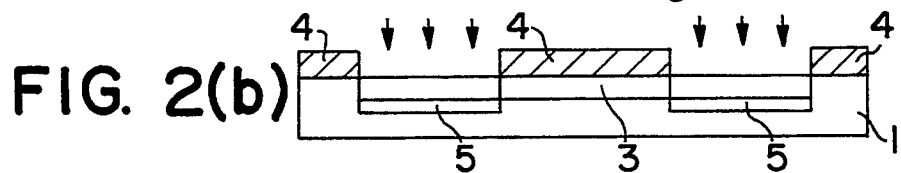
FIG. 2(b)
FIG. 2(c)
FIG. 2(d)
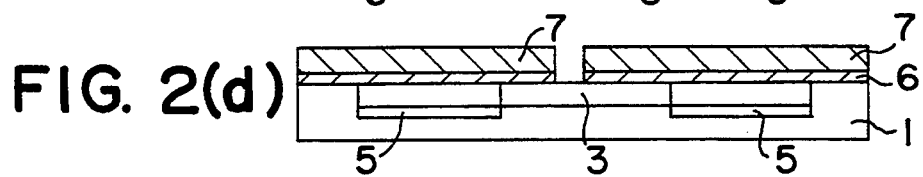
FIG. 2(e)
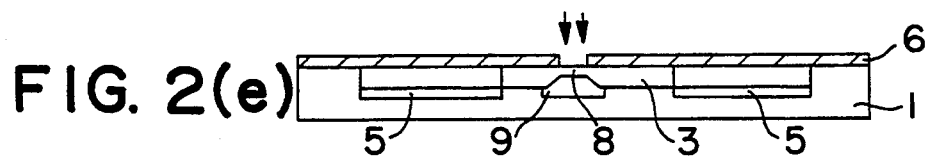
FIG. 2(f)
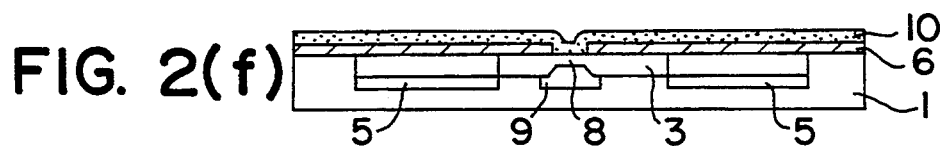
FIG. 2(g)
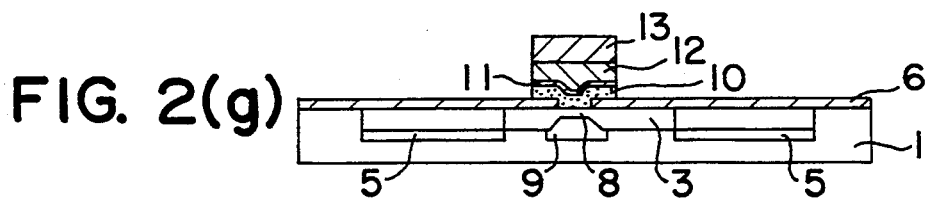
FIG. 2(h)
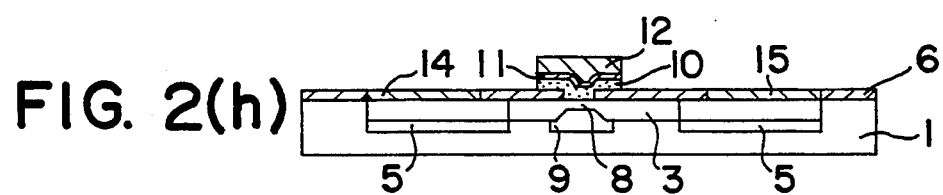

METHOD OF FABRICATING A SCHOTTKY FIELD EFFECT TRANSISTOR

This application is a division of application Ser. No. 08/053,047, filed Apr. 23, 1993, now abandoned.

BACKGROUND OF THE INVENTION

The present invention relates to a compound semiconductor, particularly, a Schottky gate field effect transistor using GaAs and its fabrication method. The Schottky gate field effect transistor will be referred to as MESFET (metal semiconductor field effect transistor) in the following.

Extensive efforts to develop a high frequency analog integrated circuit, e.g., MMIC (monolithic microwave IC), using GaAs MESFETs have been made at present and, in order to produce an integrated circuit that can operate in a higher frequency range at low dissipation power, the cut-off frequency $f_t$ of the MESFETs that make up the integrated circuit is desirable to be as high as possible.

For the purpose of increasing the cut-off frequency $f_t$, efforts have so far been made to increase the transconductance gm and shorten the gate length $L_g$ of the MESFETs. Also, in order to reduce the noise figure NF that makes an important factor for the analog integrated circuits, how to reduce source resistance $R_s$ and gate resistance $R_g$ has been an important issue.

On the other hand, the recess gate FET has been so far employed as a fabrication method of the GaAs MESFETs. However, use of a wet etching method in the recess etching process that determines the electrical characteristics of the MESFETs has caused a problem in precise control and uniformity of the etching amount. So, a self-alignment structured FET originally developed for high-speed digital ICs and characterized by having a refractory metal layer with excellent uniformity used as the gate electrode has recently been actively pursued for use in high frequency analog integrated circuits.

FIGS. 3(a)–3(f) are cross-sectional illustrations of the main fabrication steps to show how the prior art GaAs MESFETs of a self-aligned LDD (Light Doped Drain) structure with refractory metal gate are produced. As shown in FIG. 3(a), a selective ion implantation of $^{29}Si+$ is first performed under the condition of an acceleration voltage of 30 keV and a dose amount of $4 \times 10^{12}$ cm$^{-2}$ to form a region 8 on a semi-insulating GaAs substrate 1 with resist 2 used as a mask.

Next, a layer 10 of a high melting point metal such as WSi or the like, for example, is deposited by a sputtering method on the semi-insulating GaAs substrate 1 and then, as shown in FIG. 3(b), the high melting point metal layer 10 is etched by a reactive ion etching method (RIE) and with resist 16 used as a mask to form a gate electrode 10b. Then, as shown in FIG. 3(c), an ion implantation of $^{28}Si+$ is performed under the condition of an acceleration voltage of 50 keV and a dose amount of $4 \times 10^{12}$ cm$^{-2}$ by a self-alignment method with resist 17 and the foregoing gate electrode 10b used as masks to form an n-type intermediate density layer 3.

Further, as shown in FIG. 3(d), an insulating layer 6 of SiN or the like is deposited on the surface of the semi-insulating substrate 1 by a plasma CVD method to a thickness of around 50 to 500 nm and then a through implantation of $^{28}Si+$ is performed under the condition of an acceleration voltage of 150 keV and a dose amount of $4 \times 10^{13}$ cm$^{-2}$ through an insulating layer 6 with resist 18 used as a mask to form an n-type high density layer 5.

Then, the insulating layer 6 is removed by buffered hydrogen fluoride acid and, as shown in FIG. 3(e), an insulating layer 19 of $SiO_2$ or the like is deposited on the surface of the semi-insulating GaAs substrate 1 by a plasma CVD method or the like to a thickness of around 10 to 500 nm. Then, the implanted impurities are activated through annealing in a $N_2$ atmosphere at around 800° C. for about 15 minutes with the above insulating layer 19 used as an annealing cap. Lastly, as shown in FIG. 3(f), windows are formed in certain specified areas of the insulating layer 19 by means of buffered hydrogen fluoride acid or the like and an AuGe/Ni is deposited by a lift off technique to a thickness of around 200 nm and then sintered to form a source electrode 14 and a drain electrode 15, finally to complete a GaAs MESFET.

Thus, in connection with the fabrication method of GaAs MESFETs intended for use in high frequency analog integrated circuits, e.g. MMICs, an employment of the self-alignment structured FET has been examined for replacing the recess gate structured FET in consideration of the advantages anticipated in controllability and also uniformity of electrical characteristics.

However, the resistivity of the high melting point metal alloy layers that can be used in such a self-alignment structure will be ranging from 50 to 500 un. cm, which is 20 to 200 times as high as the resistivity of aluminum, e.g., 2.5 un.cm.

The increase in the gate resistance Rg due to the shortened gate length will become so large that it cannot be neglected and has been one of the main factors in restricting high frequency operation of an FET.

In order to solve this problem, metal such as Au or the like having a low specific resistance has been used as a deposit on the gate electrode after annealing for a reduction in the gate resistance. However, it is not easy to deposit Au on a gate electrode measuring 1 um and less with good reproducibility. Besides, the impurities implanted by a self-alignment method with a prior art gate electrode having a high melting point metal layer used as am ask tends to diffuse under the gate electrode in the lateral direction, making it difficult to produce MESFETs having a gate length not exceeding 0.5 um.

SUMMARY OF THE INVENTION

A field effect transistor comprises a semi-insulating semiconductor substrate, an n-type active region formed on said semiconductor substrate in a certain specified place and a Schottky gate electrode formed on said n-type active region, a p-type region formed the above semiconductor substrate and below the foregoing n-type active region in contact with the n-type active region. The Schottky gate electrode is comprised of a high melting point metal layer and a stacking layer formed of at least one layer of a low specific resistance metal layer.

According to the foregoing structure, impurities are prevented from diffusing under the gate electrode in the lateral direction. This results in an improvement in the breakdown voltage and a reduction in the gate length. At the same time, the carrier profile of the n-type active layer is enabled to present a steep slope due to the p-type region existent directly under the channel. As a result, mutual conductance gm is improved and gate resistance is reduced.

BRIEF DESCRIPTION OF DRAWINGS

FIG. 1(a)–FIG. 1(g) are a series of schematic cross-sectional illustrations to show the fabrication steps of a field effect transistor as an exemplary embodiment of the present invention.

FIG. 2(a)–FIG. 2(h) are a series of schematic cross-sectional illustrations to show the fabrication steps of a field effect transistor as another exemplary embodiment of the present invention.

DETAILED DESCRIPTION OF THE INVENTION

Figure 3A:
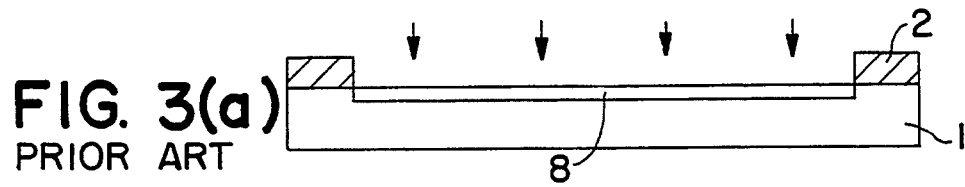
FIG. 3(a)–FIG. 3(f) are a series of schematic cross-sectional illustrations to show the fabrication steps of a prior art field effect transistor.
Figure 3B:
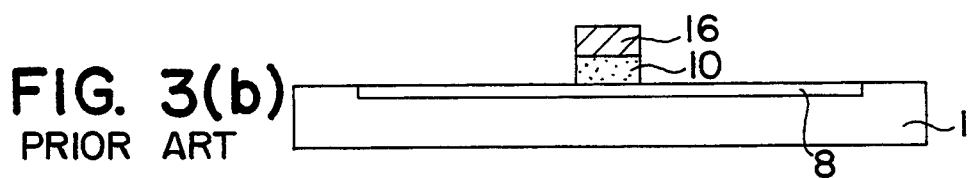
Figure 3C:
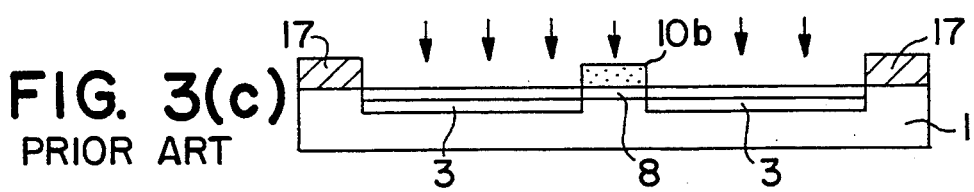
Figure 3D:
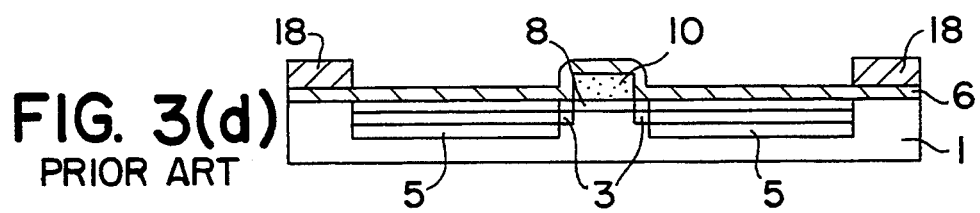
Figure 3E:
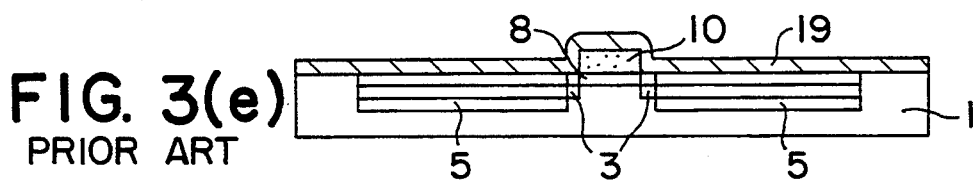
Figure 3F:
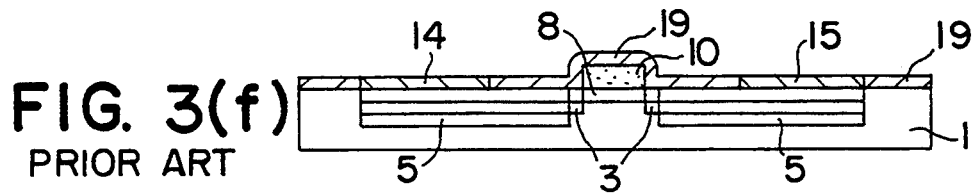

FIG. 1(a)–FIG. 1(g) show schematic cross-sectional illustrations of the fabrication steps for a GaAs MESFET to describe an exemplary embodiment of the present invention.

As shown in FIG. 1(a), a high density n-type region 5 was first formed by ion implanting $^{29}Si^+$, under the condition of an acceleration voltage of 40 keV and a dose amount of $1 \times 10^{13}$ cm$^{-2}$ on a semi-insulating GaAs substrate 1 with resist 2 used as a mask.

Then, as shown in FIG. 1(b), an insulating layer 6 such as SiN or the like was deposited by a plasma CVD method or the like to an approximate thickness between 10 and 200 nm. As shown in FIG. 1(c), resist 7 having a window was formed on the insulating layer 6 and an opening was formed on a part of the insulating layer 6 by means of a reactive ion etching method that employs $CF_4+O_2$ gas. The dimensions of the window included in resist 7 determines gate length.

After removal of the resist 7, a p-type impurity of $^{24}Mg^+$ was ion implanted under the condition of an acceleration voltage of 80 keV and a dose amount of $2 \times 10^{12}$ cm$^{-2}$ with the insulating layer 6 used as a mask to form an n-type active region 8 in compensation of a part of the high density n-type region 5. In other words, a portion of the high density n-type region 5 is compensated by $^{24}Mg^+$ which is a p-type impurity. At the same time, a p-type region 9 is formed under n-type active region 8 in contact with the n-type active region 8, as shown in FIG. 1(d).

Next, as shown in FIG. 1(e), a high melting point metal layer 10 formed of (for example) WSi was deposited by means of a sputtering method to a thickness of 10 to 40 nm and then the implanted ion were activated by thermal annealing in $N_2$ ambient at around 800° C. for about 20 minutes with the insulating layer 6 and the high melting point metal layer 10 used as an annealing cap.

Then, as shown in FIG. 1(f), after a Ti layer 11 and an Au layer 12 were successively deposited one upon another to a thickness of 50 nm and 500 nm, respectively, a gate electrode was formed by means of an ion milling method and also a reactive ion etching method with resist 13 used as a mask.

Further, with regard to FIG. 1(g), openings (not shown) were formed in a part of the insulating layer 6 by use of resist and AuGe/Ni was deposited by means of a lift off method to the thickness of around 200 nm and then thermal sintering was applied to form a source electrode 14 and a drain electrode 15.

Accordingly, a self-alignment structured GaAs MESFET with refractory metal gate 10 was produced. Not only SiN but also $SiO_2$, SION, PSG or the like can be used as the insulating layer that serves as a protection layer.

Also, the high melting point metal alloy layers may be formed of WSi, WSiN, WN, WAl or the like.

With the present exemplary embodiment, after the high melting point metal layer 10, the Ti layer 11 and the Au layer 12 were deposited successively one upon another, and the gate electrode was pattern formed by means of a photolithography method. The Ti layer 11 and the Au layer 12 are also able to be pattern formed after the high melting point metal layer 10 only was etched.

FIG. 2(a)–FIG. 2(h) show the schematic cross-sectional illustrations of the fabrication steps for a GaAs MESFET to describe another exemplary embodiment of the present invention.

As shown in FIG. 2(a), a intermediate density n-type region 3 was first formed by ion implanting $^{29}Si^+$ under the condition of an acceleration voltage of 40 keV and a dose amount of $6 \times 10^{12}$ cm$^{-2}$ on a semi-insulating GaAs substrate 1 with resist 2 used as a mask.

Then, as shown in FIG. 2(b), a high density n-type region 5 was formed by ion implanting $^{28}Si^+$ under the condition of an acceleration voltage of 80 keV and a dose amount of $2 \times 10^{13}$ cm$^{-2}$ with resist 4 used as a mask As shown in FIG. 2(c), an insulating layer 6 such as SiN or the like was deposited by means of a plasma CTD method or the like to an approximate thickness between 10 and 200 nm.

Next, as shown in FIG. 2(d), resist 7 having a window was formed on the insulating layer 6, The window dimensions determine gate length. In addition, an opening was formed at an off-centered position between the high density n-type region 5 serving as the source region and that serving as the drain region on the insulating layer 6 by means of a reactive ion etching method that employs $CF_4+O_2$ gas.

After removal of the resist 7, a p-type impurity of $^{24}Mg^+$ was ion implanted under the condition of an acceleration voltage of 80 keV and a dose amount of $2 \times 10^{12}$ cm$^{-2}$ with the insulating layer 6 used as a mask to form an n-type active region 8 in compensation of a part of the intermediate density n-type region 3 and at the same time to form a p-type region 9 under said n-type active region 8 in contact with said n-type active region 8, as shown in FIG. 2(e).

Then, as shown in FIG. 2(f), a high melting point metal layer 10 formed of (for example) WSi and serving as a Schottky gate electrode was deposited by means of a sputtering method to a thickness of 10 to 40 nm. Then the implanted ions were activated by thermal annealing in $N_2$ ambient at around 800° C. for about 20 minutes with the insulating layer 6 and the high melting point metal layer 10 used as an annealing cap.

As shown in FIG. 2(g), after a Ti layer 11 and an Au layer 12 were successively deposited one upon another to a thickness of 50 nm and 500 nm, respectively, a gate electrode was formed by means of an ion milling method and a reactive ion etching method with resist 13 used as a mask.

Then, as shown in FIG. 2(h), an opening was formed in a part of the insulating layer 6 by use of resist and AuGe/Ni was deposited by means of a lift off method to a thickness of around 200 nm. Thermal sintering was then applied to form a source electrode 14 and a drain electrode Accordingly, a self-alignment asymmetrical LDD structured GaAs MESFET with a refractory metal gate melting point metal (referring to layers 10, 11 and 12) was produced.

By realizing a LDD (Lightly Doped Drain) structure as a result of the formation of an intermediate density n-type region 3 between a n-type region 5 and a n-type active region 8, the electric field distribution in the horizontal direction was relaxed with resultant suppression of a short channel effect and also enhancement of the MESFET breakdown voltage.

Also, with the present exemplary embodiment, the high density n-type region 5 was able to be formed by ion implanting selectively in advance, and the asymmetrical structure was readily realized with MESFETs having a higher drain breakdown voltage.

In addition, not only SiN but also $SiO_2$, SION, PSG or the like can be used as the insulating layer that serves as a protection layer. Also, in the high melting point metal layer 10 are included such high melting point layers as formed of WSi, WSiN, WN, WAl or the like.

After the high melting point metal layer 10, the Ti layer 11 and the Au layer 12 were deposited successively one upon another, and the gate electrode was pattern formed by means of a photolithography method. In addition, the Ti layer 11 and the Au layer 12 are able to be pattern formed after only the high melting point metal layer 10 was etched.

According to the present invention as described in the foregoing, a structure is realized wherein an n-type active region is formed in a part of a high density n-type region in a self-alignment manner with a p-type impurity implanted through a window of an insulating layer which determines the effective gate length. At the same time, a p-type region is formed under the n-type active region in contact with the n-type active region. By forming a structure in this manner, inwards diffusion of the impurity in the lateral direction is prevented. In addition, an enhancement in the withstanding voltage and a reduction in the gate length results. Also, steepening of the carrier profile in the n-type active region due to the p-type region being located directly under the channel is obtained resulting in an improvement of the mutual conductance $g_m$.

In addition, since the gate length is determined by the dimensions of the insulating layer window, it is easy to shorten the gate length. In the gate processing after annealing, it is easy to reduce the gate resistance through the deposition of low specific resistance metal for wiring.

Further, when an intermediate density n-type region is introduced, a high density n-type region can be ion implanted selectively in advance and an asymmetrical LDD structure can be realized readily.

Therefore, a self-alignment structured GaAs MESFET having a high cut-off frequency $f_t$ can be produced with uniformity and excellent reproducibility.

What is claimed:

1. A method of fabricating a field effect transistor, comprising the steps of:
   forming a high density n-type region in a portion of a semiconductor substrate by ion implantation;
   forming an insulating layer on the surface of the semiconductor substrate;
   forming a window in a portion of said insulating layer;
   forming a) an n-type active region directly under the window formed in said portion of said insulating layer by ion implanting a p-type impurity on the surface of the semiconductor substrate with the insulating layer used as a mask, and b) a p-type region under said n-type active region in contact with said n-type active region by compensating the high density n-type region;
   forming a high melting point metal layer to make a Schottky gate electrode on the surface of the semiconductor substrate;
   annealing the semiconductor substrate with the insulating layer and the high melting point metal layer used as protection layers;
   forming at least one low specific resistance metal layer on the high melting point metal layer;
   removing a portion of said low specific resistance metal layer and the foregoing high melting point metal layer by means of a photolithographic technique and forming a Schottky gate electrode on the n-type active region exposed in the window; and
   forming a source electrode and a drain electrode on the high density n-type region in respective portions of the insulating layer.

2. A method of fabricating a field effect transistor according to claim 1, wherein the insulating layer is selected from the group consisting of silicon nitride, silicon dioxide, silicon oxynitride and phosphosilicate glass.

3. A method of fabricating a field effect transistor according to claim 1, wherein the high melting point metal layer is selected from the group consisting of tungsten silicide (WSi), tungsten silicon nitride (WSiN), tungsten nitride (WN) and tungsten aluminum (WAl).

4. A method of fabricating a field effect transistor, comprising the steps of:
   forming a high density n-type region in a portion of a semiconductor substrate by ion implantation;
   forming an insulating layer on the surface of the semiconductor substrate;
   forming a window in a portion of said insulating layer;
   forming a) an n-type active region directly under the window formed in said portion of said insulating layer by ion implanting a p-type impurity on the surface of the semiconductor substrate with the insulating layer used as a mask, and b) a p-type region under said n-type active region and in contact with said n-type active region by compensating the high density n-type region;
   forming a high melting point metal layer to make a Schottky gate electrode on the surface of the semiconductor substrate;
   annealing the semiconductor substrate with the insulating layer and the high melting point metal layer used as an annealing cap;
   removing a portion of the high melting point metal layer by means of a photolithographic technique and forming a Schottky gate electrode on the n-type active region exposed in the window;
   forming at least one low specific resistance metal layer on said Schottky gate electrode; and
   forming a source electrode and a drain electrode on the high density n-type region and in respective portions of the insulating layer.

5. A method of fabricating a field effect transistor according to claim 4, wherein the insulating layer is selected from the group consisting of silicon nitride, silicon dioxide, silicon oxynitride and phosphosilicate glass.

6. A method of fabricating a field effect transistor according to claim 4, wherein the high melting point metal layer is selected from the group consisting of tungsten silicide (WSi), tungsten silicon nitride (WSiN), tungsten nitride (WN) and tungsten aluminum (WAl).

* * * * *